United States Patent [19]

Hoeft

[11] Patent Number: 4,542,349
[45] Date of Patent: Sep. 17, 1985

[54] DIGITAL CONTROLLED AMPLIFIER
[75] Inventor: Werner H. Hoeft, Saratoga, Calif.
[73] Assignee: Precision Monolithics, Inc., Santa Clara, Calif.
[21] Appl. No.: 578,971
[22] Filed: Feb. 10, 1984
[51] Int. Cl.[4] .............................................. H03G 3/20
[52] U.S. Cl. .................................... 330/279; 330/254; 330/86
[58] Field of Search ............... 330/254, 256, 289, 278, 330/279, 284, 86, 97

[56] References Cited
U.S. PATENT DOCUMENTS
4,027,281  5/1977  Greve et al. ......................... 330/278
4,234,804  11/1980  Bergstrom ............................ 307/229

Primary Examiner—James B. Mullins
Assistant Examiner—G. Wan
Attorney, Agent, or Firm—Koppel & Harris

[57] ABSTRACT

A digital control amplifier is provided as a unitary monolithic device to control the transfer function of an analog signal in response to a digital control, such as from a digital computer. A current transfer cell is employed which uses an amplifier circuit having transistors of like polarity, and is capable of both attenuation and greater than unity amplification of an input analog signal. A digital-two-analog converter is integrated into the system and employs a series of current dividers which enables a common reference current to be used for each bit of the converter. A current reference circuit for the converter employs a band gap voltage regulator with a temperature compensation design that varies the control signal applied to the current transfer cell to compensate for temperature-induced variations in the output of the cell.

12 Claims, 9 Drawing Figures

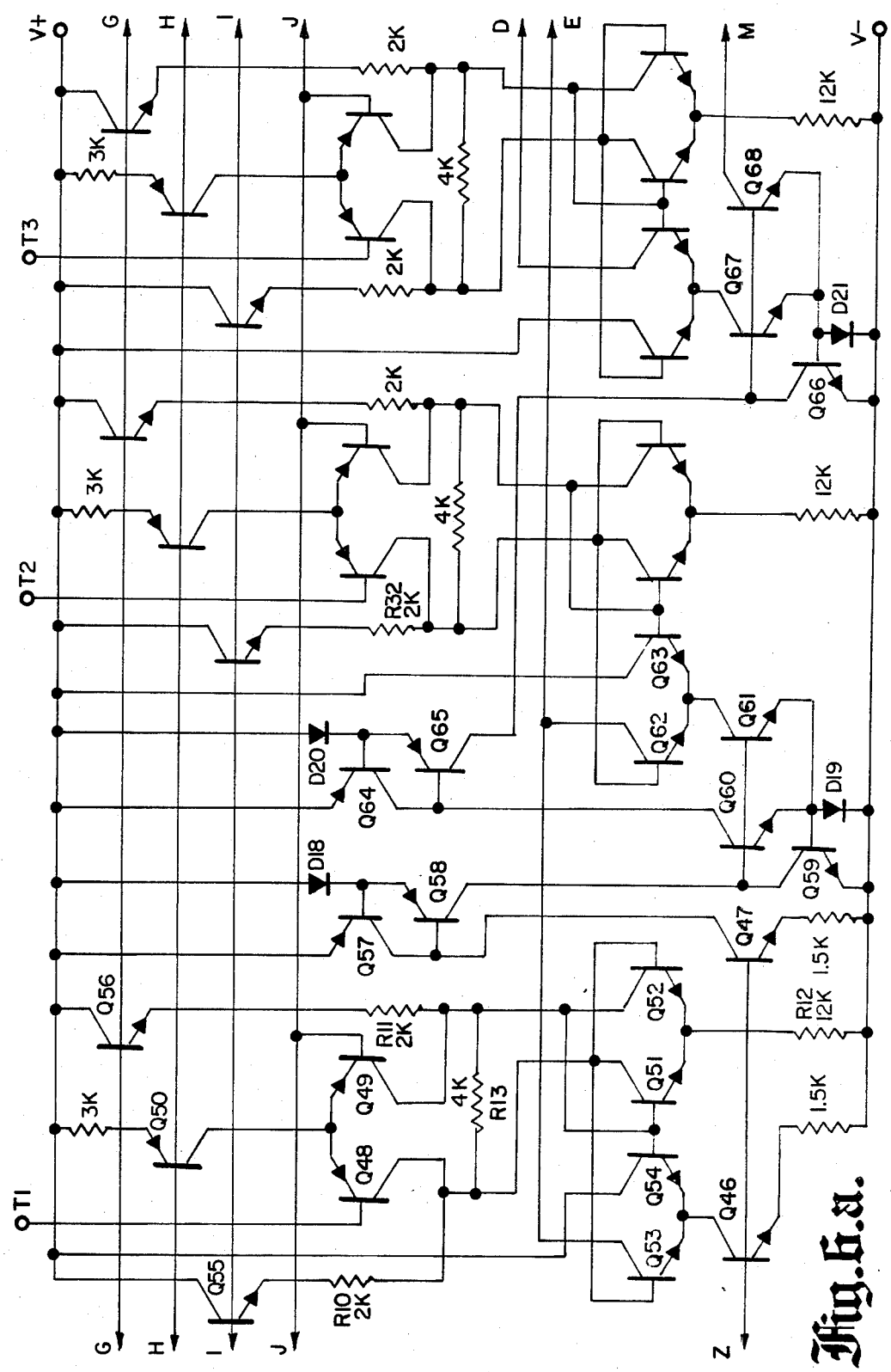

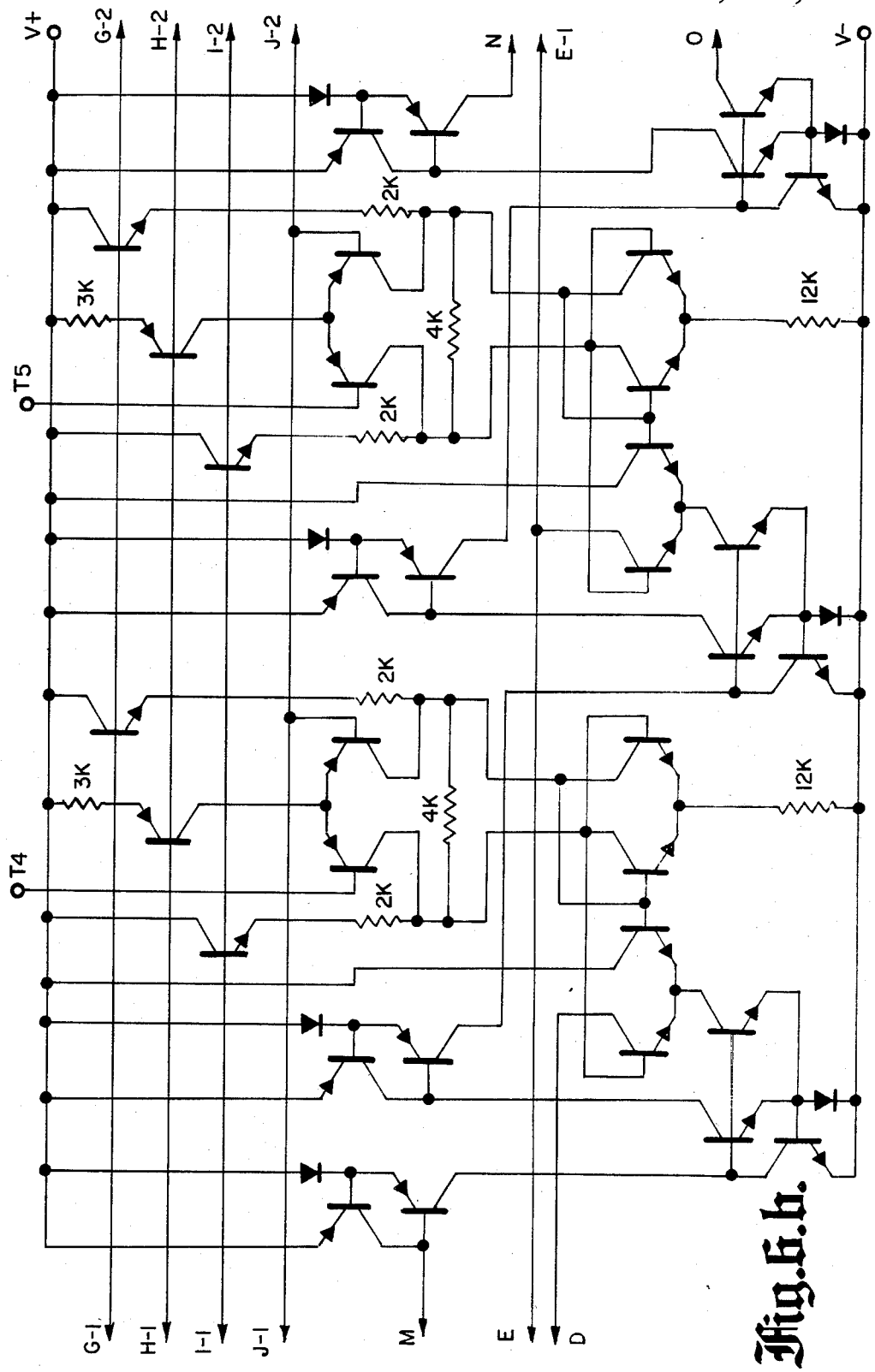
Fig.6.b.

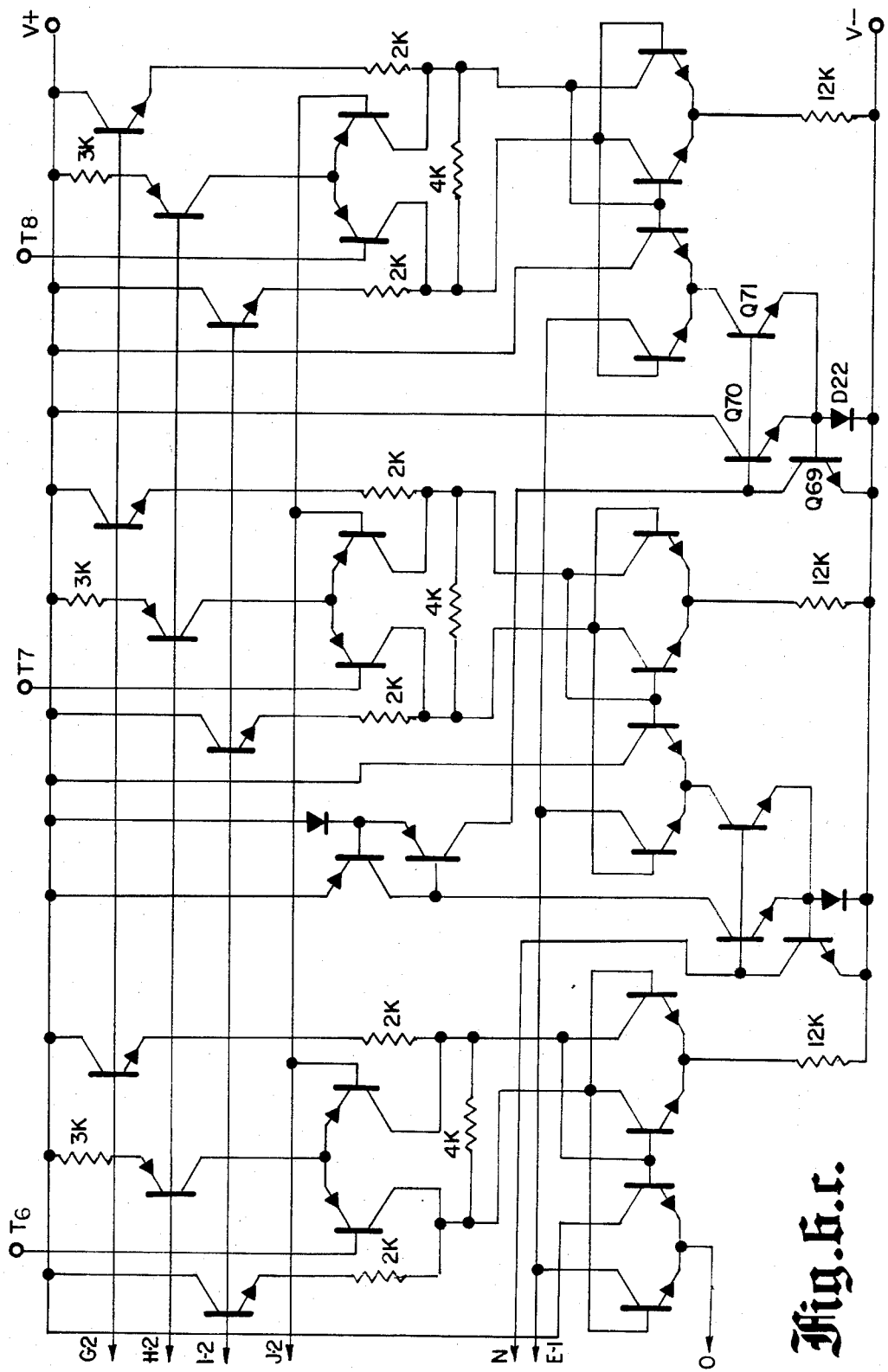

DIGITAL CONTROLLED AMPLIFIER

BACKGROUND OF THE INVENTION

1. Field of the Invention

This invention relates to an amplifier for analog signals in which the amplifier transfer function is controlled by a digital code, and more particularly to an amplifier in which a current transfer cell is controlled in response to a multiple bit digital control signal.

2. Description of the Prior Art

Prior attempts to control the amplification transfer function for an analog signal in response to a digital control signal have utilized discrete components. For example, when it is desired to use the output of a digital computer to control an analog signal, the analog signal has typically been fed through a voltage controlled amplifier, and the output of the computer has been processed through a digital-to-analog converter (DAC) to place it in an analog format suitable for controlling the voltage controlled amplifier. A popular type of amplifier used for this purpose is disclosed in U.S. Pat. No. 4,234,804, assigned to DBX Corporation.

The addition of a separate DAC tends to result in a mismatching between the computer and the amplifier, requiring retrimming of the converter and making it more difficult to achieve repeatability in volume production. Furthermore, combining such discrete devices makes the resultant digital controlled amplifiers quite temperature sensitive, with large temperature drifts in the order of 3000 parts per million per degree centigrade. The amplifier's control range is also quite limited, as is its linearity.

SUMMARY OF THE INVENTION

In view of the above problems associated with the prior art, the principle object of the present invention is the provision of a digital controlled amplifier for analog signals which has a high degree of manufacturing repeatability, is relatively insensitive to temperature changes, and exhibits an improved control range and linearity.

Another object of the present invention is the provision of a digital controlled amplifier for analog signals which is integrated into a single monolithic device rather than pieced together from discrete components, thereby removing the tolerance limitations of individual discrete components as limiting factors in the amplifier's performance, and which provides a wide temperature compensated control range with a microprocessor compatible digital control signal.

These and other objects are accomplished in the present invention by constructing a digital controlled amplifier in a unitary design which is capable of being implemented as a monolithic device. The amplifier provides a gain or attenuation as determined by a digital code, such as the output of a computer. An input analog signal is modified in accordance with the digital code by the use of a novel current transfer circuit to produce a desired analog output signal. The current transfer circuit includes a pair of differential amplifiers which are controlled in response to the digital code to govern the transfer function between the input and output analog signals. The amplifiers are formed from transistors of like polarity, thereby improving linearity, increasing the circuit's dynamic range, and alleviating temperature mismatch problems.

The device includes an integral DAC which employs a unique system of current dividers instead of the differential amplifiers typically employed in conventional DACs, and has a common reference current for each stage of the converter. The most significant bit circuit includes a pair of matched current dividing transistors which are connected for common biasing by a reference current circuit. One of the transistors provides the most significant bit current, while the other transistor provides a reference current for the next most significant bit. Each successive bit (except for the last) similarly divides the reference current provided by the previous bit, with half of the reference current used as the bit current and the other half providing a reference for the next bit. This current division arrangement eliminates a mismatch problem encountered in the prior art due to lost base current in each stage of the converter, and also results in dividing errors in half from stage to stage, rather than accumulating errors as in prior art devices.

The digital controlled amplifier includes a special temperature compensation feature which gives the current transfer cell excellent temperature tracking capabilities. The circuit which generates the reference current for the DAC portion of the amplifier includes a circuit which has a temperature coefficient that causes the reference current to vary with temperature so as to adjust the control signal provided by the converter to the current transfer circuit, and thereby substantially compensate for temperature variations in the current transfer circuit. In a preferred embodiment, this temperature compensation feature includes a band gap voltage regulator circuit, a current source transistor which provides the reference current, a circuit for sensing the current differential between the band gap transistors and for generating a voltage signal which varies in accordance with that differential, and another circuit which applies the voltage signal as a base bias to the reference current source transistor, whereby temperature induced variations in the current differential are reflected as a compensating change in the bias applied to the reference current transistor. The current source transistor provides the current for the most significant bit circuit, while a differential amplifier with its differential inputs connected to the band gap regulator transistors is used to sense the current differential. The current through one branch of the differential amplifier is mirrored and transmitted through a resistor to generate the base bias signal for the reference current source transistor.

The described circuitry also increases the dynamic range of the current transfer circuit, so that amplification as well as attenuation of the input analog signal can be obtained. This is accomplished by connecting the outputs of certain bit circuits in the converter section to one input of a differential amplifier in the current transfer circuit, and the outputs of the remaining bit circuits to the other differential amplifier input. With an appropriate selection of bits for each amplifier input, a desired range of attenuation/amplification can be achieved.

These and other features and advantages of the invention will be apparent to those skilled in the art from the following detailed description of a preferred embodiment, taken together with the accompanying drawings, in which:

BRIEF DESCRIPTION OF THE DRAWINGS

FIGS. 6(a), 6(b) and 6(c) are schematic diagrams of successive portions of the logic converter circuitry employed in the invention; and FIG. 7 is a schematic diagram of the reference current supply circuitry.

DETAILED DESCRIPTION OF A PREFERRED EMBODIMENT

Figure 1:
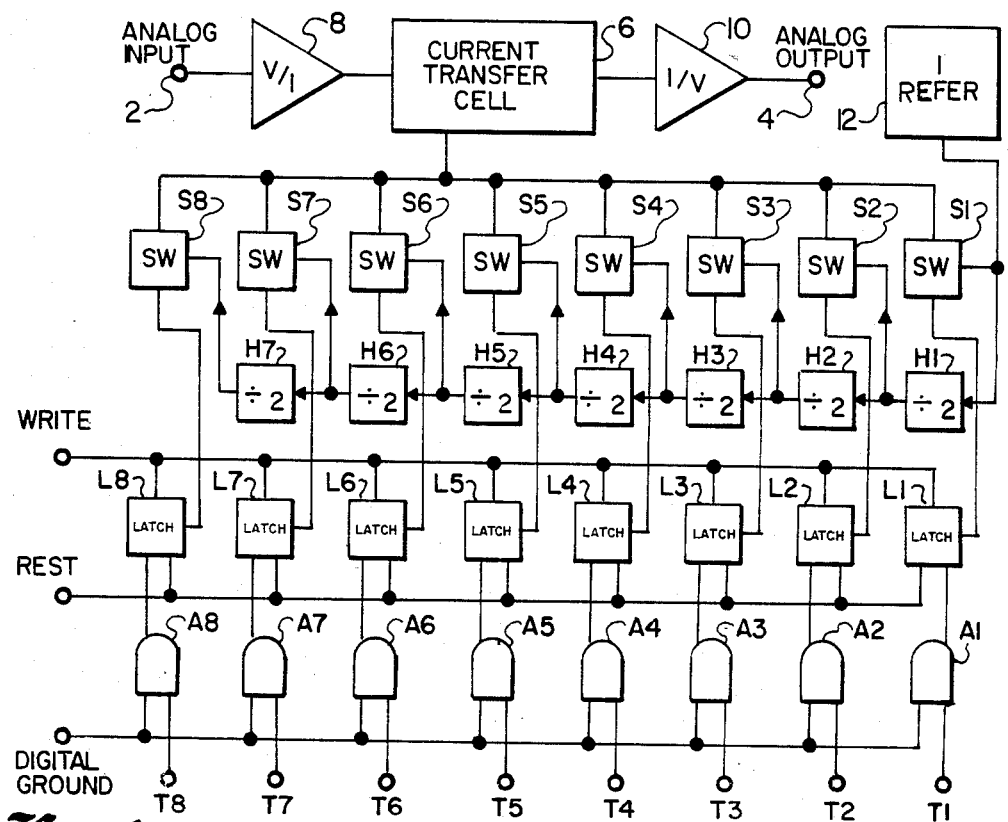
FIG. 1 is a block diagram of a digital controlled amplifier constructed in accordance with the invention.

FIG. 1 shows the overall digital controlled amplifier circuit of the present invention. A terminal 2 is provided to receive an input analog signal which is to be amplified under the control of a separate digital signal (in this context the term "amplify" includes amplification factors both greater and less than unity, i.e., both greater than unity amplification and attenuation). An output terminal 4 receives the analog signal after amplification and processing by the remainder of the circuitry. A current transfer circuit 6, details of which are discussed hereinafter, has a control input for receiving a control signal from the digital logic portion of the circuitry, and in response to the control signal imposes a specified transfer function upon an input current signal to produce a related output current signal. An input circuit 8 is connected to input terminal 2 to receive an analog input voltage signal, and converts the voltage signal to an input current signal for presentation to current transfer cell 6. The output current signal from the current transfer cell is delivered to an output circuit 10, which converts the current signal to an output voltage signal applied to output terminal 4.

The digital controlled amplifier illustrated in FIG. 1 is designed to be controlled by an 8 bit digital signal. Digital terminals T1-T8 are provided to receive the respective bit signals, which typically could be provided from a digital computer. T1 is the input terminal for the most significant bit (the bit of greatest binary value), while the remaining terminals are arranged to receive binary bits of progressively descending values, with terminal T8 receiving the least significant bit. Each digital terminal is connected to a respective amplifier A1-A8 for comparison with a digital ground reference, the outputs of the amplifiers being connected to respective latch circuits L1-L8. L8.

Under the influence of RESET and WRITE controls, the latch circuits deliver signals in response to the inputs from their respective input amplifiers to respective switch circuits S1-S8. The switch circuits are gated to transmit a current signal to the current transfer circuit 6 during the time interval following the appearance of a positive digital signal at their respective digital input terminals T1-T8.

A current reference circuit 12 establishes a reference current which is equal in value to the desired output current of the most significant bit. As explained below, special temperature compensation circuitry is provided so that temperature induced drifts in the operation of current transfer circuit 6 are compensated by the current reference circuit, thereby producing an overall operation for the amplifier which is relatively temperature insensitive over a given temperature range. The current output of current reference circuit 12 is delivered to switch S1 and thereby, when the switch is closed in response to the presence of a digital signal at terminal T1, to the common switch output line 14 for delivery to current transfer circuit 6. The reference current is also delivered to a halving circuit H1, which divides the reference current in two and delivers the divided output to switch S2 and another halving circuit H2, the currents delivered to S2 and H2 each being half of the reference current. The reference current is again divided by two in halving circuit H2, with the divided outputs delivered to S3 and a third halving circuit H3. Similar circuitry is provided for the other bit circuits, so that the switch for each bit receives a current which is half of the current delivered to the switch for the next greater significant bit. Thus, the magnitudes of the current outputs of switches S1-S8 will be in binary order, and the collective circuitry between T1-T8 and S1-S8 will operate as a digital-to-analog converter. The use of current dividers to obtain a binary relationship between successive bit circuits effectively eliminates a current mismatch problem encountered in prior art DACs, in which successive differential amplifiers were used to attain a binary relationship and the input currents and output currents of the differential amplifiers did not match because of lost base current.

Figure 2:
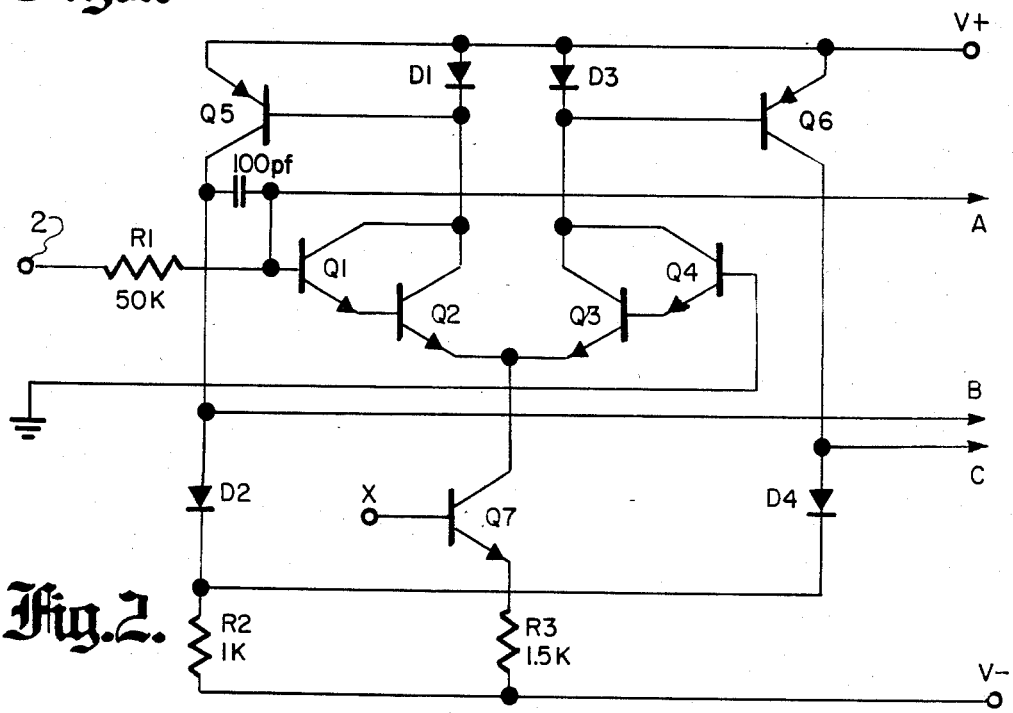
FIGS. 2 and 3 are schematic diagrams of an input circuit used to convert an input analog voltage signal to a current signal, and an output circuit used to convert an output current analog signal to a voltage signal, respectively.

Turning now to FIG. 2, a schematic diagram of input converter amplifier 8 is shown. Transistors Q1, Q2, Q3 and Q4 are connected in a Darlington input stage to receive the analog input current from input terminal 2 through a resistor R1, the Darlington input stage being used to minimize bias current. The collectors of Q1 and Q2 are mirrored via transistor Q5 and diode D1 into a diode load D2, while the collectors of Q3 and Q4 are mirrored via transistor Q6 and diode D3 into a diode load D4. The outputs of D2 and D4 are jointly connected through a common resistor R2 to a negative voltage bus, while a positive voltage supply is connected to Q5, D1, Q6 and D3. Current is provided for the Darlington input stage by a current source transistor Q7, which is connected from the common emitters of Q2 and Q3 to the negative voltage bus through resistor R3, and is biased by bias line X. Connections to the current transfer circuit 6 (shown in detail in FIG. 5) are provided from the base of Q1 and the anodes of D2 and D4.

Figure 3:
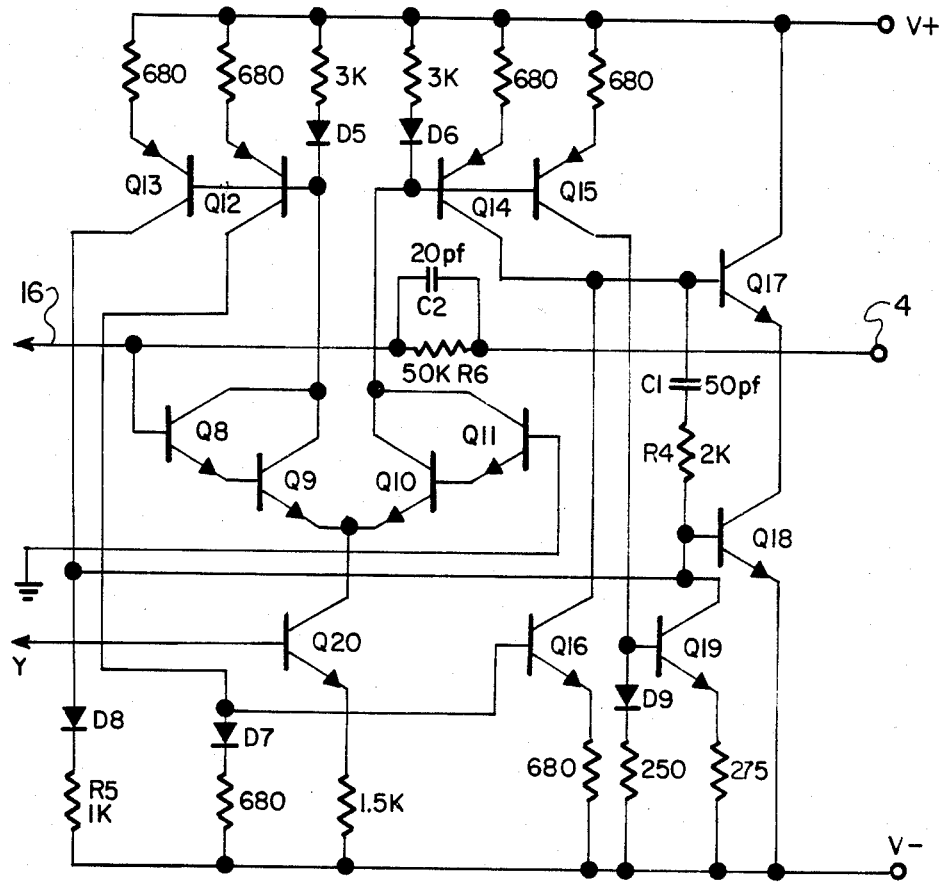

Details of the output converter amplifier 10 are shown in FIG. 3. The output current signal from current transfer circuit 6 is delivered along line 16 to a Darlington stage consisting of transistors Q8, Q9, Q10 and Q11. This differential Darlington stage, which exhibits a low input bias current, has as its collector loads a pair of current mirrors comprising diode D5 and pnp transistors Q12 and Q13 that the collectors of Q8 and Q9, and diode D6 and pnp transistors Q14 and Q15 at the collectors of Q10 and Q11. The diodes are implemented, in the usual fashion for integrated circuits, as transistors with their bases and collectors tied together, and are scaled so that the current through the pnp transistors is three times the diode current.

Current is transmitted from transistors Q12, Q13, Q14 and Q15 through diode D7, diode D8, transistor Q16 and diode D9, respectively, to the negative voltage bus. The current through Q12 is mirrored via D7 and Q16 to provide the voltage gain and swing for the output. A pair of transistors Q17, Q18 are connected in series between the positive and negative voltage buses, with the output terminal 4 taken from the connection between the emitter of Q17 and collector of Q18. The base Q17 is connected for biasing to the common collectors of Q14 and Q16, while the base of Q18 is connected to the collectors of Q13 and another transistor Q19. Resistor R4 and capacitor C1 are connected in series between the bases of Q17 and Q18.

Transistor Q19, the emitter of which is connected through a resistor to the negative voltage bus, has its base connected to the anode of D9 and the collector of Q15. It is scaled to operate at a current which is 10% less than the current through Q13, leaving the balance of the current for biasing diode D8. The quiescent output current is set by the ratio of the emitter areas of Q18 to D8, and by the Q18 base-emmitter voltage differential across resistor R5, which is connected between D8 and the negative voltage bus.

Another transistor Q20, biased by bias line Y, is connected between the emitters of Q9, Q10 and the negative voltage bus to draw current through the Darlington input stage. The current available for the load is equal to the current through this transistor Q20 multiplied by three times the current gain of Q18. Since the gain setting of the amplifier is done internally, a parallel R-C circuit consisting of resistor R6 and capacitor C2 is connected between input line 16 and the connection for output terminal 4, with C2 serving as a feedforward capacitor to compensate for the capacitance present at the input line 16.

Figure 4:
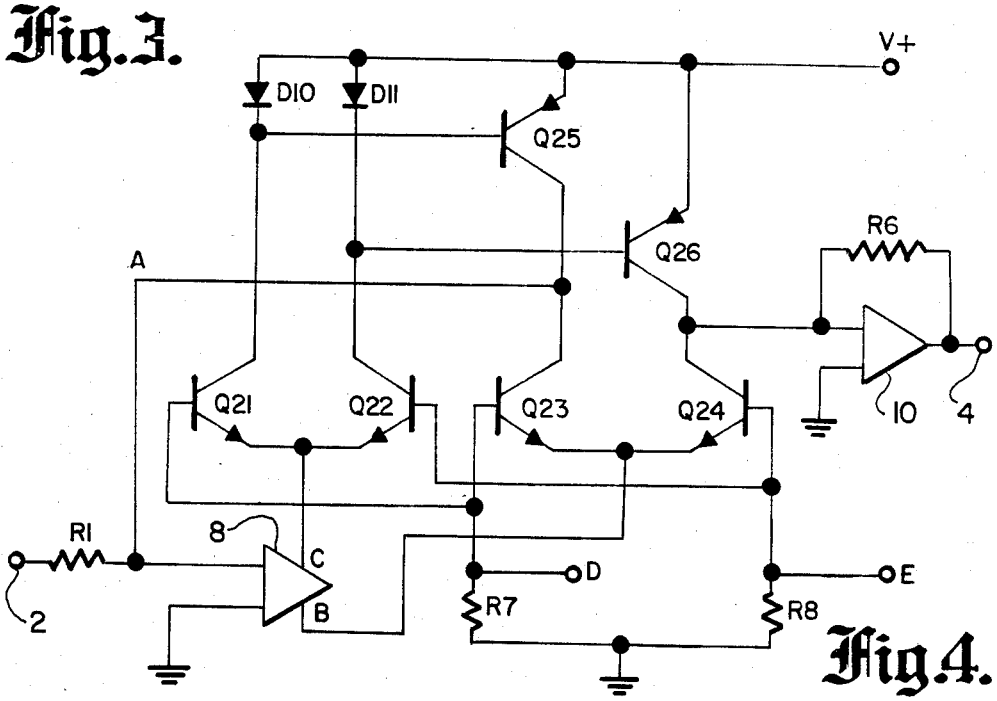
FIGS. 4 and 5 are respectively simplified and schematic diagrams of the current transfer circuit employed in the invention.

Referring now to FIG.4, a simplified diagram of the current transfer circuit 6, together with the input and output converters 8 and 10, is shown. The current transfer circuit uses a pair of differential amplifiers formed by transistors Q21, Q22 and Q23, Q24. Q21 and Q22 are connected to the positive voltage bus through diodes D10 and D11, respectively, while the collectors of Q23 and Q24 are respectively connected to the positive voltage bus through transistors Q25 and Q26. The bases of Q25 and Q26 are connected to the collectors of Q21 and Q22, respectively. The output from the current transfer circuit is taken from the collector of Q24 and delivered to the output converter 10. Current is drawn through the two differential amplifiers Q21, Q22 and Q23, Q24 over lines B and C from input converter 8, while the negative input to the converter is delivered over line A to the collector of Q23.

The collector current of Q21 is mirrored via D10 and Q25 into Q23, while the collector current of Q22 is mirrored via D11 and Q26 into Q24. The analog signal arriving at the negative input to converter 8 modulates the no-signal bias current of the differential amplifiers Q21, Q22 and Q23, Q24, with the collectors of Q23 and Q25 providing current feedback to the converter. Since the feedback current has to match the input current, the signal current through Q21, Q22 and Q23, Q24 will be equal to the input current. By matching all of the devices in their geometry, the signal current available at the collector junction of Q24 and Q26 will be equal to that of the input. This current drives the converter 10, which converts the current back into a voltage signal for application to output terminal 4.

A dual control signal representative of the digital signal at the digital input terminals T1-T8 is applied to the terminals marked D and E, and from there respectively to the bases of Q21, Q23 and Q22, Q24. The control terminals are connected to ground through resistors R7 and R8, respectively. The signals applied to terminals D and E are derived from the DAC portion of the circuitry, which is shown in the one-line diagram of FIG. 1 and is discussed in detail below. Signals applied at control terminal D produce a greater than unity gain for the current transfer circuit, while signals applied at control terminal E produce a less than unity gain (attenuation). When the bases of all the transistors in the two differential amplifiers are at the same potential, the transfer from the input to the output of the current transfer circuit equals one. When a more positive voltage is applied to control terminal E and thereby to the bases of Q22 and Q24, the current through Q22 and Q24 will increase, while the current through Q21 and Q23 will be reduced. The output current from the transfer circuit will also increase, by the ratio of the Q24,Q23 collector currents.

Correspondingly, when the signal at terminal D is higher than that at terminal E, the currents through Q22 and Q24 will decrease while the currents through Q21 and Q23 will increase. This condition causes an attenuation in the input-to-output transfer function of the transfer circuit.

All of the transistors in the differential amplifiers, i.e., Q21, Q22, Q23 and Q24, are of like polarity, specifically npn. This offers an advantage over prior art current transfer circuits, in which transistors of unlike polarity were mixed. It has been found that with such mixing the junctions between unlike transistors do not track well over temperature because of differing temperature coefficients. The use of transistors of like polarity has been found to substantially cure this temperature mismatch problem, to improve the linearity of the current transfer circuit, and to increase the circuit's dynamic range.

Figure 5:
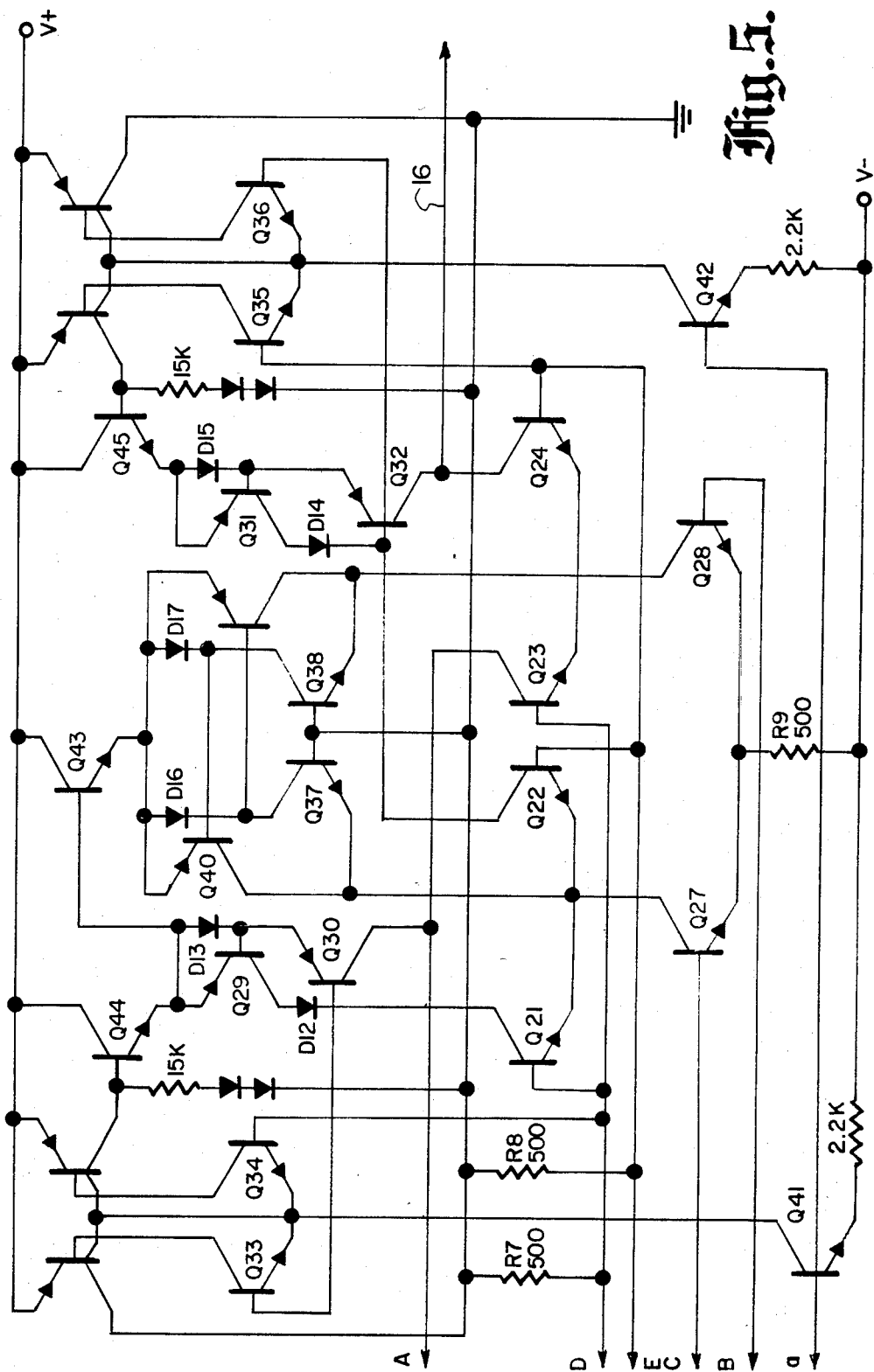
Figure 2:
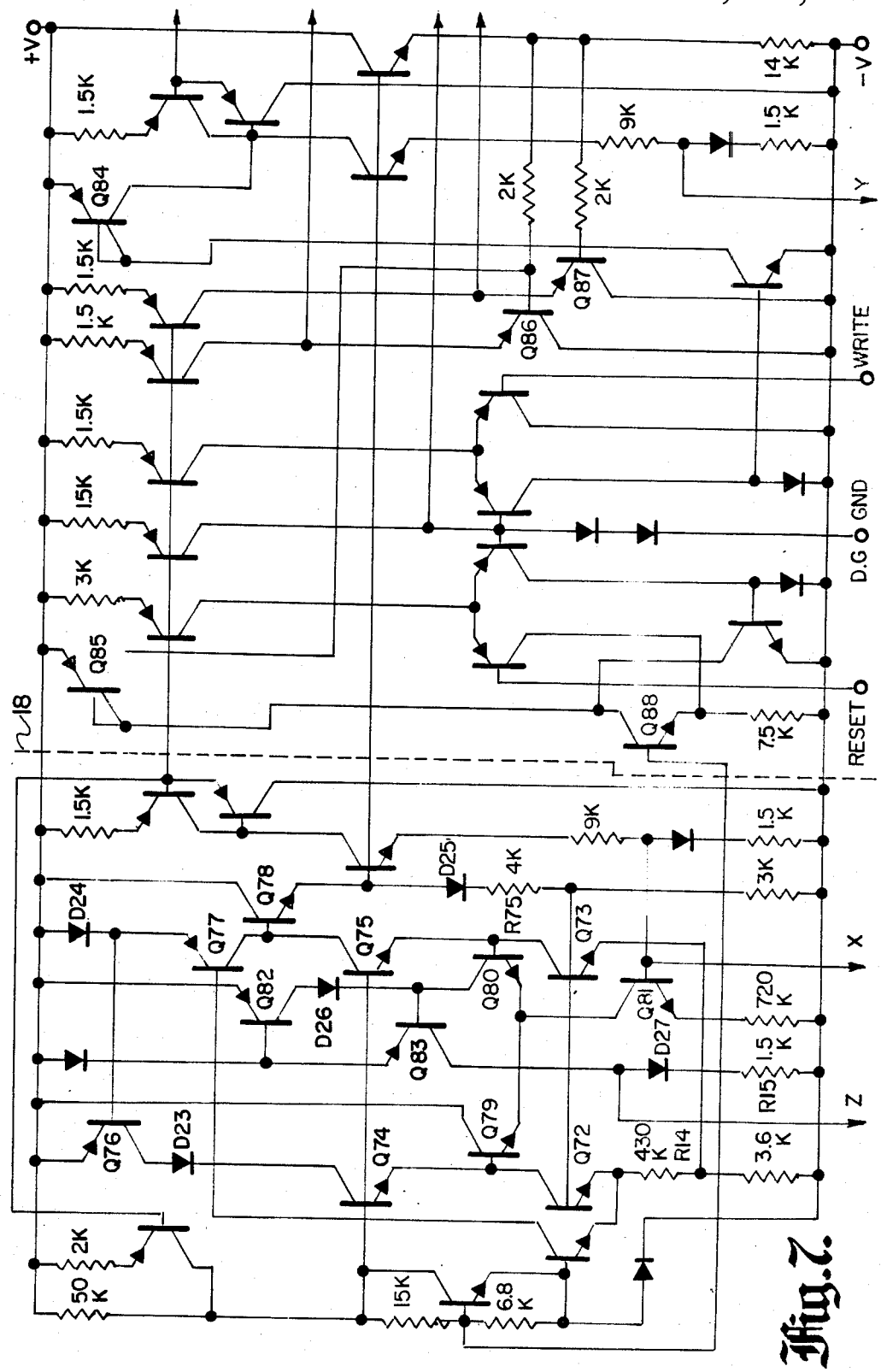

A more detailed schematic diagram of the current transfer circuit is shown in FIG. 5. It can be seen that current is drawn through the differential amplifiers Q21, Q22 and Q23, Q24 by transistors Q27 and Q28, which are respectively biased by the signals on lines C and B from the input converter. The emitters of Q27 and Q28 are connected together through a resistor R9 to the negative voltage bus. A first current mirror circuit consisting of transistors Q29 and Q30 and diodes D12 and D13 is connected to the collector of Q21, while a second current mirror circuit consisting of transistors Q31 and Q32 and diodes D14, D15 is connected to the collector of Q22. The mirrored outputs of these mirror circuits are connected to the collectors of Q23 and Q24 to form the current transfer circuit, the input to which is applied to the collector of Q23 along line A and the output of which is taken from the collector of Q24 along line F.

Both of the mirror circuits just described are in a control loop which includes amplifiers formed by transistors Q33, Q34 and Q35, Q36. These transistors adjust the collectors of Q21 and Q22 to the same potential as the collectors of Q23 and Q24, thus providing a good current transfer from input to output. Additional circuitry is provided for reducing noise currents at the output of the current transfer circuit. This is accomplished by a pair of grounded base transistors Q37 and Q38, the emitters of which are connected respectively to the common emitter connections of Q21, Q22, and Q23, Q24. Q37 and Q38 are cross-coupled by a pair of current mirrors D16, Q39 and D17, Q40, which are connected to add to the currents from Q38 and Q37 delivered to the differential amplifier junctions. In the quiescent state the currents through the differential amplifier transistors Q21, Q22 and Q23, Q24 are cut in half by passing half of their currents through Q37, Q38 and the current mirrors. Under dynamic conditions, however, the currents from the current mirrors are reinserted into the signal pass. This circuit configuration reduces the noise current to the output in half with no loss of load drive capability.

Additional circuitry employed in the current transfer circuit includes current source transistors Q41 and Q42, which are biased by bias line X are connected respectively to draw current from amplifiers Q33, Q34 and Q35, Q36, transistor Q43 which is connected to supply current to the noise current cancellation circuitry, and current supply transistors Q44 and Q45 for the differential amplifier current mirrors. Other circuitry of a conventional nature is shown in FIG. 5 and need not be described in detail herein.

A detailed schematic diagram for the DAC portion of the digital controlled amplifier is shown in FIG. 6(a), 6(b), and 6(c). Since the DAC includes eight bit circuits and much of the circuitry is repetitive, only the two most significant bit circuits and the least significant bit circuit will be described in detail. The circuitry for the most significant bit is shown on the left hand side of FIG. 6(a). A reference current for this bit is delivered from the current reference circuit 12 (indicated in FIG. 1) over bias line Z. The bias signal on line Z is applied to a pair of matched transistors Q46 and Q47, the first transistor Q46 providing the most significant bit current and the other transistor Q47 providing a reference current for the next most significant bit circuit.

Tracing the circuit which produces the output current for the most significant bit, one transistor Q48 of a differential amplifier pair, Q48, Q49, is connected to the first digital input terminal T1 to be gated in response to the presence or absence of a digital bit signal at T1. Current is provided to the differential amplifier by current source Q50. The differential amplifier Q48, Q49 is connected to a latch circuit consisting of transistors Q51 and Q52, the collectors of which are respectively connected to bias differential switch transistors Q53 and Q54, which correspond to switch S1 in FIG. 1. The emitters of Q53 and Q54 are connected to the negative voltage bus through Q46 and a resistor. The collector of Q54 is tied to the positive voltage bus, while the collector of Q53 provides the output of the most significant bit circuit over output line D. This output line is connected to the attenuating control input in the current transfer circuit (see FIG.4).

The Q53, Q54 differential switch is operated by the latch circuit Q51, Q52. Q51 is connected to a load consisting of a resistor R10 and the base-emitter junction of a transistor Q55, while Q52 is connected to a load consisting of a resistor R11 and the base-emitter junction of a transistor Q56. The bases and collectors of Q51 and Q52 are cross-coupled to provide the latching action, while latch control is achieved by the pnp differential amplifier Q48, Q49 and the associated current source Q50. The current through the latch is set by a resistor R12 which is connected between the emitters of Q51, Q52 and the negative voltage bus, by the current from the latch control, and by the reference voltages applied over lines I and G to the bases of Q55 and Q56. Another resistor R13, which is connected between the collectors of Q48 and Q49, limits the swing generated by the latch.

Transistor Q46 thus provides the output bit current for the most significant bit. Its paired transistor Q47, which is matched and commonly biased with Q46 so that it carries the same current as Q46, is connected in circuit with a current mirror consisting of transistors Q57, Q58 and diode D18. This current mirror causes a current equal to that through Q47 and Q57 to be delivered via D18 and Q58 to a Wilson current mirror consisting of transistors Q59, Q60 and Q61 and diode D19. In this latter circuit Q60 and Q61 are provided with a common bias, and together provide a current to D19 which is equal to the current through Q47. Since Q60 and Q61 have matching geometries, each one effectively carries half of the current through D19, and thus half of the current through Q47 and Q46. This accomplishes the current dividing function of halving circuit H1 shown in FIG.1.

Q61 is connected to provide the bit current for the second most significant bit circuit, while Q60 is connected to another current mirror and Wilson current mirror circuit to provide a reference current for the third most significant bit circuit. The second most significant bit circuit, which is provided with a digital input signal from terminal T2, is designed identically to the most significant bit circuit (with the exception that the reference current for the second most significant bit is received from the most significant bit of the DAC, whereas the reference current for the most significant bit is received from a separate reference current circuit). Q61 draws current through a differential amplifier in the second bit circuit consisting of transistors Q62 and Q63, with Q62 connected to provide a bit output over output line D, and Q63 connected to the positive voltage bus. Reference current transistor Q60 is connected to a current mirror consisting of transistors Q64, Q65 and diode D20, which provides a mirrored current to a Wilson current mirror circuit consisting of transistors Q66, Q67, Q68 and diode D21. This latter Wilson current mirror resides in the third most significant bit circuit, with transistors Q67 and Q68 each carrying half of the current through the second bit reference current transistor Q60. Q67 provides an output for the third most significant bit, while Q68 provides a reference current for the fourth most significant bit. This pattern of dividing the reference current for each bit in half, with one-half being used for the bit output and the other half used as a reference current for the next most significant bit, is repeated for the remaining bit circuits, shown in FIGS. 6(b) and 6(c), until the least significant bit circuit connected to terminal T8. This last bit circuit has a Wilson current mirror Q69, Q70, D22 similar to the Wilson current mirrors of the other bit circuits, with the reference current from the previous bit circuit divided by transistors Q70 and Q71, and Q71 supplying the bit output current. Since this is the last bit circuit, there is no need to provide a reference current for any other bits, and the collector of Q70 is accordingly tied directly to the positive voltage bus to terminate the successive divisions of the initial reference current.

In the preferred embodiment, the outputs of the third and fourth most significant bits are connected over output line D to the greater than unity amplifying input to the current transfer circuit (shown in FIGS. 4 and 5), while the outputs of the remaining bit circuits are connected over output line E to the attenuating input of the current transfer circuit. By thus controlling the transfer characteristic of the current transfer circuit, a wide transfer range is achieved without loss of feedback control. This is an advantage over prior art circuits, in which the current transfer cell operated only to attenuate the incoming analog signal. The exclusive use of npn transistors in the switching portion of the current transfer cell makes the attainment of both attenuation and positive amplification feasible.

In operation, a digital control signal from a computer or other digital device would appear as a series of binary signals applied to digital input terminals T1–T8. Depending upon the presence of absence of a digital signal at their respective digital input terminals, the output differential switches of the various bit circuits will be biased to either steer the bit current to the appropriate output line D or E, or to dump the bit current into the positive voltage bus. All the bit switches which are gated "ON" in response to a digital signal at their respective digital input terminals complete a circuit connection between their respective bit circuits and the control for the current transfer circuit, the collective result of the operation of each of the different bit switches being to apply a control signal to the current transfer circuit which reflects the pattern of digital signals. The magnitude of the output analog signal produced by the current transfer cell will thereby correspond to the digital control signal applied to the DAC circuit.

Turning now to FIG. 7, details of the current reference circuit 12 from FIG. 1 are shown. The circuitry includes a temperature compensation feature which adjusts the reference current supplied to the DAC in such a manner that temperature induced variations in the output of the current transfer circuit are balanced out by opposing variations in the control signal applied to the current transfer circuit by the DAC.

The circuit of FIG. 7 can generally be divided into two sections: a band gap voltage regulator to the left of vertical line 18, and bias, RESET and WRITE control circuitry to the right of line 18. Except for the temperature compensation feature, much of the design of the band gap voltage regulator is conventional, and need not be described in detail. The regulator includes a pair of common biased transistors Q72 and Q73, the collectors of which are respectively connected through cascaded transistors Q74 and Q75 to drive a Wilson current mirror circuit consisting of transistors Q76, Q77 and diodes D23, D24, and an output transistor Q78. This output supplies the feedback for the band gap and the reference voltage, plus current for the remainder of the circuit. The emitter of Q78 is connected through diode D25 back to the bias line for band gap transistors Q72 and Q73. The emitter areas of the two band gap transistors have 4:1 ratio, which sets the ratio of their collector-emitter currents and their base-emitter voltages at 4:1 also. The band gap voltage, which is equal to the difference in the base-emitter voltages of Q72 and Q73, is applied across the band gap resistor R14. The band gap control loop, consisting of cascoded transistors Q74, Q75, the Wilson current mirror Q76, Q77, D23, D24 and output devices Q78, D25, maintains the base-emitter voltage differential between Q72 and Q73 at a constant 4:1 ratio over a given temperature range in a conventional manner.

In accordance with the invention, additional circuitry is provided in the band gap voltage regulator to fix the differential between the collector currents of Q23 an Q24 in the current transfer circuit (FIGS. 4 and 5) at a constant level for a given digital control signal despite variations in temperature, and thus provide a substantially temperature independent output from the current transfer circuit. Recognizing that, in accordance with the transistor junction formula, the collector current differential between Q23 and Q24 varies in positive proportion to the transistor base voltage and in inverse proportion to absolute temperature, the present invention accomplishes temperature compensation by adjusting the control voltage applied to the bases of Q23 and Q24 so that it varies substantially linearly with absolute temperature, and thereby balances out temperature-induced changes in the junction formula.

This is accomplished by using temperature-induced changes in the voltage across band gap resistor R14 as a base for adjusting the reference current. Since the voltage across R14 is derived from the differential between the base-emitter voltages of two transistors Q72 and Q73, it will vary substantially linearly with temperature. A special circuit is provided to detect such variations and adjust the reference current accordingly. This circuit includes a differential amplifier formed by transistors Q79 and Q80, with the base of Q79 connected to the collector of Q72 and the emitter of Q74, and the base of Q80 connected to the collector of Q73 and the emitter of Q75. The emitters of Q79 and Q80 are tied together to a current source transistor Q81, while the collector of Q79 is tied to the positive voltage bus and the collector of Q80 is mirrored by a Wilson current mirror Q82, Q83, D26 into a series connected diode D27 and resistor R15. Q74 and Q75 are matched, and act as sensors for changes in the collector-emitter currents of band gap transistors Q72 and Q73. This causes the base-emitter voltage differential between differential amplifier transistors Q79 and Q80 to be offset with temperature in the same ratio as the temperature-induced base-emitter voltage offset between Q72 and Q73. The collector currents of Q79 and Q80 are offset by the same ratio, with the collector of Q80 mirrored by the Wilson current mirror into D27 and R15. The current through these last two elements, and thus the voltage developed across them, is thus adjusted with temperature by an amount corresponding to the temperature-induced current and base-emitter voltage differential between band gap transistors Q72 and Q73, and also the temperature-induced change in voltage across band gap resistor R14.

The voltage across D27 and R15 is taken over bias line Z to provide the bias signal for the current reference transistors Q46 and Q47 in the DAC circuit (FIG. 6(a)). Thus, the temperature coefficient of the band gap voltage regulator is used to set the temperature coefficient for the control signal supplied to the differential amplifiers in the current transfer circuit, which as a result exhibits excellent temperature tracking. With the novel current transfer circuit of this invention in conjunction with the special reference current compensation design, the control range and tracking over temperature is limited only by the integrated circuit fabrication technology employed and its associated tolerances.

The bias, RESET and WRITE circuitry to the right of line 18 in FIG. 7 is generally conventional, and may be described briefly. The RESET and WRITE controls are accomplished with a pnp differential amplifier, as in the latch controls for the bit circuits, in order to provide a universal logic interface. All logic thresholds are biased by a current source to a voltage level which is two base-emitter voltages above digital ground. This permits an external setting of the threshold to any desired level by applying a voltage to the digital ground pin. The WRITE control, when grounded, shuts off the current to all of the gate current sources via transistor Q84. The RESET control offsets the latch reference voltage via Q85 by shifting the base of transistor Q86 to a higher potential than the base of Q87, thus causing all of the latches to be flipped into the "O" position. Also included in this function is the power on reset, which is controlled by transistor Q88 and an initial bias circuit. RESET overrides all other control functions, whereas the WRITE control inhibits only the control bits.

While a particular embodiment of the invention has been shown and described, various modifications and alternate configurations will occur to those skilled in the art. For example, the output of the current transfer circuit may be brought out separately, with external interconnections used to produce a digital control filter. Accordingly, it is intended that the invention be limited only in terms of the appended claims.

I claim:

1. A digital controlled amplifier, comprising:
   an input terminal for receiving an analog signal to be amplified,
   an output terminal for receiving an amplified analog signal,
   a current transfer circuit adapted to receive an input current signal and to produce an output current signal in response thereto, said current transfer circuit including control terminal means to receive a control signal, said control signal governing the magnitude of the output current signal relative to the input current signal,
   input circuit means connected between the input terminal and the current transfer circuit for presenting an analog signal at the input terminal as an input current signal for the current transfer circuit,
   output circuit means connected between the current transfer circuit and the output terminal for presenting an output current signal from the current transfer circuit as an output analog signal at the output terminal,
   means for producing a reference current,
   a plurality of bit circuits adapted to produce a corresponding plurality of bit currents, said bit currents being progressively decremented with respect to the reference current and to each other,
   a plurality of digital input circuits, corresponding in number to the number of bit circuits, for receiving a multi-bit digital control signal, and
   a plurality of bit switches, each switch connected to interface between a respective digital input circuit, a respective bit circuit and the control terminal means for the current transfer circuit, each bit switch completing or interrupting a circuit connection between its respective bit circuit and the control terminal means in response to the digital signal at its respective digital input circuit, whereby as a collective result of the operation of each of the bit switches a control signal is applied to the current transfer circuit to control the magnitude of the output analog signal at the output terminal.

2. The digital controlled amplifier of claim 1, said bit circuits comprising current dividers connected to progressively divide the reference current, said bit currents being obtained from respective divisions of the reference current.

3. The digital controlled amplifier of claim 2, the bit circuit for the most significant bit comprising a pair of matched current dividing transistors connected for common biasing by the reference current means, one of said transistors being connected to provide a bit current and the other transistor being connected to provide a reference current for the next most significant bit circuit, and each subsequent bit circuit except for the least significant bit comprising a pair of matched current dividing transistors connected to divide the reference current provided by the previous bit circuit, one of said transistors being connected to provide the bit current for that bit circuit and the other transistor being connected to provide a reference current for the next most significant bit circuit.

4. The digital controlled amplifier of claim 3, further comprising a plurality of current mirror circuits connected to provide a reference current interface between respective successive pairs of bit circuits.

5. The digital controlled amplifier of claim 1, the response of said current transfer circuit to a given control signal varying in accordance with a known temperature coefficient, said means for producing a reference current including circuit means having a temperature coefficient causing the reference current to vary with temperature so as to adjust the control signal to substantially compensate for the temperature variation of the current transfer circuit.

6. The digital controlled amplifier of claim 5, said means for producing a reference current including a band gap voltage regulator circuit which includes two band gap transistors and is adopted to produce a voltage across a first resistor as the difference between the base-emitter voltage of said two transistors, a reference current source transistor connected to receive a base bias signal and to provide the reference current, means for sensing the current differential between the band gap transistors and for generating a voltage signal which varies in accordance with said current differential, and circuit means applying said voltage signal as a base bias signal to said reference current source transistor, whereby temperature induced variations in said current differential are reflected as a compensating change in the bias applied to the reference current source transistor.

7. The digital controlled amplifier of claim 6, said reference current source transistor being connected to provide the current for the first bit circuit.

8. The digital controlled amplifier of claim 6, said current differential sensing and voltage generating means comprising a differential amplifier having its differential inputs connected respectively to the collector-emitter circuits of the band gap transistors, and means for mirroring the current in one branch of the differential amplifier through a resistor to generate the base bias signal for the reference current source transistor.

9. The digital controlled amplifier of claim 1, said current transfer circuit comprising a differential amplifier circuit, one branch of said differential amplifier circuit comprising a first transistor circuit connected to provide an output signal to the output circuit means and the other branch comprising a second transistor circuit connected to receive an input signal from the input circuit means, said bit circuits connected to provide transistor base control signals to said first and second branches, respectively, said control signals being obtained from respective combinations of the bit circuits outputs, one of said control signals when applied to its respective amplifier branch generating a greater than unity gain transfer characteristic for the current transfer circuit, and the other control signal when applied to its respective amplifier branch generating an attenuated transfer characteristic for the current transfer circuit.

10. The digital controlled amplifier of claim 9, all of the transistors in said differential amplifier circuit being of like polarity.

11. The digital controlled amplifier of claim 10, all of the transistors in said differential amplifier circuit comprising npn transistors.

12. The digital controlled amplifier of claim 1, implemented as a unitary monolithic device.

* * * * *